(12) United States Patent
Lindblad et al.

(10) Patent No.: US 9,989,223 B1
(45) Date of Patent: Jun. 5, 2018

(54) LED LIGHTING APPARATUS WITH LEDS AND WIRES ATTACHED TO METAL SHEET MEMBER BY ADHESIVE

(71) Applicant: AUTOMATED ASSEMBLY CORPORATION, Lakeville, MN (US)

(72) Inventors: Scott Lindblad, Lakeville, MN (US); David Neuman, Randolph, MN (US)

(73) Assignee: Automated Assembly Corporation, Lakeville, MN (US)

( * ) Notice: Subject to any disclaimer, the term of this patent is extended or adjusted under 35 U.S.C. 154(b) by 193 days.

(21) Appl. No.: 14/642,329

(22) Filed: Mar. 9, 2015

(51) Int. Cl.
| | |
|---|---|
| *F21V 23/00* | (2015.01) |
| *F21V 19/00* | (2006.01) |
| *F21K 99/00* | (2016.01) |
| *H01L 27/15* | (2006.01) |
| *F21Y 101/02* | (2006.01) |
| *F21Y 105/00* | (2016.01) |

(52) U.S. Cl.
CPC .............. *F21V 19/005* (2013.01); *F21K 9/30* (2013.01); *F21V 19/0025* (2013.01); *F21V 23/001* (2013.01); *H01L 27/153* (2013.01); *F21Y 2101/02* (2013.01); *F21Y 2105/001* (2013.01)

(58) Field of Classification Search
CPC ........ F21S 4/10; F21S 4/15; F21S 4/20–4/26; F21S 4/28; F21Y 2103/10; F21Y 2105/16; G02B 6/0083; G02F 2001/133612; H01L 27/153; H01L 33/62; F21V 23/002; F21V 23/003
See application file for complete search history.

(56) References Cited

U.S. PATENT DOCUMENTS

| | | | | |
|---|---|---|---|---|
| 3,894,225 | A * | 7/1975 | Chao ...................... | G09F 13/28 174/117 A |
| 5,265,792 | A * | 11/1993 | Harrah ................ | H01L 25/0753 156/566 |
| 2002/0113244 | A1* | 8/2002 | Barnett .................... | F21L 4/027 257/98 |
| 2005/0213321 | A1* | 9/2005 | Lin ..................... | H05B 33/0803 362/231 |
| 2006/0098438 | A1* | 5/2006 | Ouderkirk ............ | H05K 1/0203 362/294 |
| 2007/0035969 | A1* | 2/2007 | Kaneko ............. | G02F 1/133603 362/633 |
| 2007/0145403 | A1* | 6/2007 | Tomioka ............... | H01L 33/486 257/99 |
| 2008/0074871 | A1 | 3/2008 | Mies et al. | |
| 2008/0123334 | A1* | 5/2008 | Hochstein ............... | F21V 29/70 362/249.01 |
| 2008/0128739 | A1* | 6/2008 | Sanpei ................. | H05K 1/0203 257/99 |

(Continued)

*Primary Examiner* — Anh Mai
*Assistant Examiner* — Steven Horikoshi
(74) *Attorney, Agent, or Firm* — Crawford Maunu PLLC

(57) ABSTRACT

A disclosed lighting apparatus includes a support structure having a sheet metal member. The sheet metal member has a first surface. An adhesive layer is directly attached to the first surface of the sheet metal member. A plurality of light-emitting diode (LED) components are attached to the sheet metal member by the adhesive layer. A plurality of wires are attached to the sheet metal member by the adhesive layer and are coupled to the plurality of LED components for providing power to the LED components.

17 Claims, 5 Drawing Sheets

(56) References Cited

U.S. PATENT DOCUMENTS

| | | | |
|---|---|---|---|
| 2010/0220479 A1* | 9/2010 | Yamashita | F21K 9/00 362/249.02 |
| 2011/0170314 A1* | 7/2011 | Hsu | F21V 29/004 362/612 |
| 2011/0232087 A1* | 9/2011 | Chiu | F21K 9/90 29/887 |
| 2014/0038325 A1* | 2/2014 | Marutani | H01L 33/62 438/28 |
| 2014/0061684 A1* | 3/2014 | Marutani | H01L 33/62 257/88 |
| 2014/0111982 A1* | 4/2014 | Kuenzler | F21V 19/005 362/217.05 |
| 2014/0240980 A1* | 8/2014 | Howe | F21V 3/0445 362/235 |
| 2014/0313713 A1* | 10/2014 | Andrews | F21S 4/001 362/235 |

* cited by examiner

LED LIGHTING APPARATUS WITH LEDS AND WIRES ATTACHED TO METAL SHEET MEMBER BY ADHESIVE

FIELD OF THE INVENTION

The disclosed embodiments generally relate to an LED lighting apparatus.

BACKGROUND

LED-based lighting is becoming more popular due in part to the energy efficient qualities and durability of LEDs. Though energy efficient, LEDs generate a large quantity of heat during operation. If the heat is not sufficiently dissipated, the efficiency, brightness, and expected life span of the LEDs may be reduced, and the color temperature may change.

SUMMARY

One lighting apparatus includes a support structure having a sheet metal member. The sheet metal member has a first surface. An adhesive layer is directly attached to the first surface of the sheet metal member. A plurality of light-emitting diode (LED) components are attached to the sheet metal member by the adhesive layer. A plurality of wires are attached to the sheet metal member by the adhesive layer and are coupled to the plurality of LED components for providing power to the LED components.

In another embodiment, a method of making a lighting apparatus includes applying an adhesive layer to a first surface of a sheet metal member, and attaching a plurality of LED components to the sheet metal member with the adhesive layer. The method attaches a plurality of wires to the sheet metal member with the adhesive layer and couples the plurality of wires to the plurality of LED components.

The above summary is not intended to describe each disclosed embodiment. The figures and detailed description that follow provide additional example embodiments and aspects.

BRIEF DESCRIPTION OF THE DRAWINGS

Other aspects and advantages will become apparent upon review of the Detailed Description and upon reference to the drawings in which.

DETAILED DESCRIPTION

Figure 1:
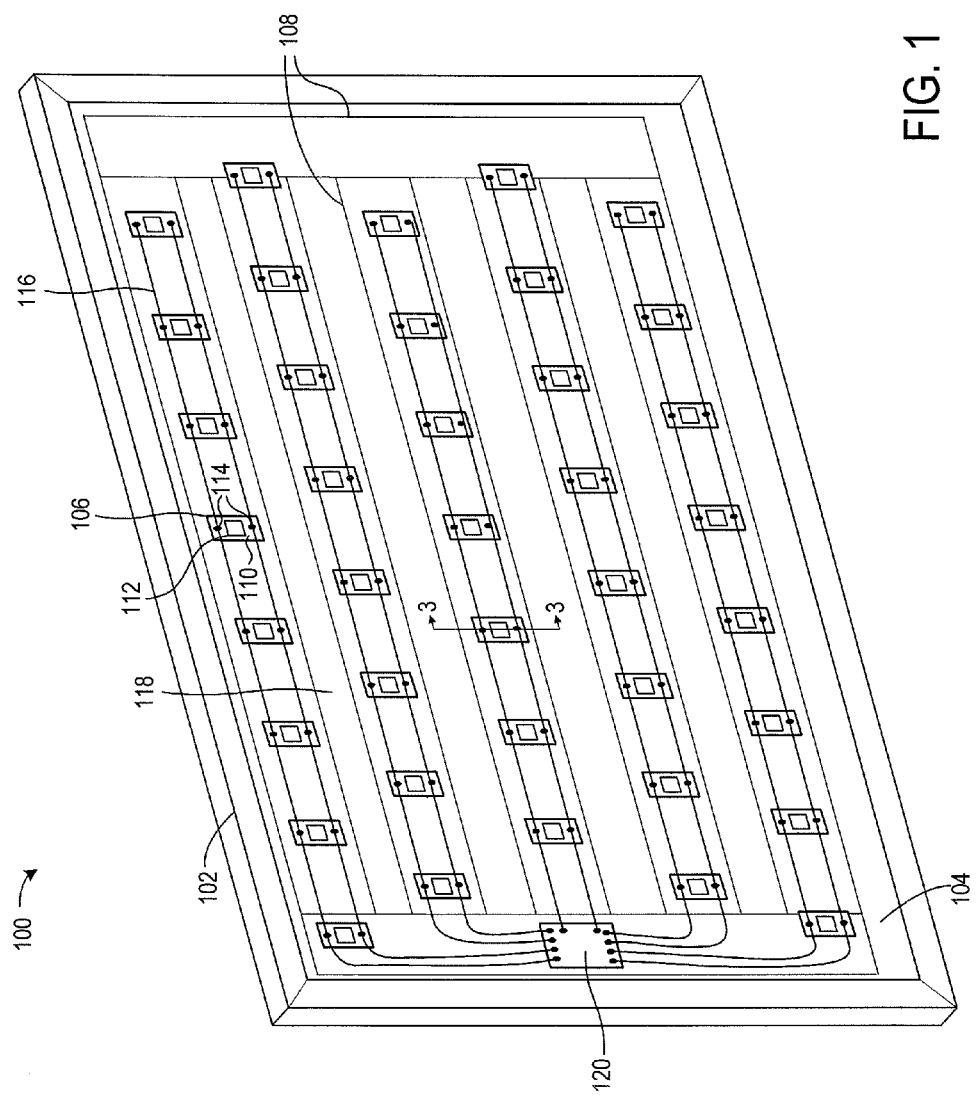
FIG. 1 shows an LED lighting apparatus having adhesive strips attached to a sheet metal member of a support structure, LED components attached to the adhesive strips, and power wiring connected to the LED components.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed embodiments offer a number of benefits over prior LED-based lighting solutions. The disclosed lighting apparatus provides improved heat dissipation and reduced manufacturing costs. The structure may be easily adapted for different applications.

Placing the LED components of the lighting apparatus in near contact with a sheet metal member provides a large heat sink for dissipating heat from the LED component. In one apparatus, an adhesive layer is directly attached to a surface of the sheet metal, and the LED components are attached to the adhesive layer. In another apparatus, the LED components and power and wiring are disposed on a flexible printed circuit board (PCB), and the flexible PCB is attached to the surface of the sheet metal by the adhesive layer. The nearby attachment of the flexible PCB and LED components to the sheet metal member provides a large heat sink.

The lighting apparatus may be configured as a troffer, which includes a sheet metal member to which the LED components may be attached as described herein. The sheet metal member, being an integral part of the troffer, provides a large heat sink. As the sheet metal member provides the heat sink, additional structure is unnecessary for dissipating heat from the LEDs.

Manufacturing costs may be reduced, because the sheet metal serves as both the support structure for the LEDs and as a heat sink. In structures having straps, lead frames, or LED packages and wiring laid on the adhesive layer, the LEDs may be disposed in nearly any desired pattern on the sheet metal without adding to manufacturing complexity or incurring additional manufacturing costs.

FIG. 1 shows an LED lighting apparatus having adhesive strips attached to a sheet metal member of a support structure, LED components attached to the adhesive strips, and power wiring connected to the LED components. The lighting apparatus 100 includes a support structure 102 and multiple LED components attached to a sheet metal member 104 of the support structure. Element 106 is an example of one of the LED components.

The sheet metal member 104 may be any part of the support structure that is suitable for a particular lighting application. For example, in one implementation, the support structure 102 may be a troffer, such as those used in many fluorescent down-light applications. The sheet metal member 104 may be a panel that wholly or partially encloses a back side of the support structure 102. In an implementation having additional metal members supporting the sheet metal member, the entire support structure may function as a heat sink.

The LED components are attached to one of two opposing surfaces of the sheet metal member 104. In an example implementation, the LED components are attached to the sheet metal member by an adhesive layer. The adhesive layer may be formed with multiple adhesive strips, such as adhesive strips 108. Each adhesive strip is directly attached to the surface of the sheet metal member, and the LED components are directly attached to the adhesive strip. The adhesive strips may include a pressure sensitive adhesive (PSA) or thermally conductive adhesive and may be applied to the sheet metal member with an adhesive transfer tape.

The LED components are attached to the sheet metal member 104 by the adhesive layer, placing them proximate the sheet metal member for heat dissipation. The adhesive strips 108 provide a convenient mechanism for attaching multiple rows of LED components to the sheet metal member 104. Each LED component may be mounted on a respective a strap or lead frame. The LED component may be a bare LED chip or a packaged LED chip, and the strap/lead frame has bond pads that are coupled to the LED component and exposed for connections to power and wiring. For example, LED component 106 includes strap/lead frame 110, LED component 112, and bond pads 114. It will be recognized that a packaged LED chip generally includes an optical lens, electrodes, and resin that encapsulates the LED for protection. A bare LED die does not have an optical lens, electrodes, or an encapsulant.

Conductive wiring 116, which has a circular cross section, is disposed on the adhesive layer and connected to the bond pads on the straps/lead frames. In one implementation, fine-gauge insulated wiring (e.g., a conductive core surrounded by an electrically insulative jacket) may be used. Alternatively, the wiring may be bare wire. For some applications, 44 gauge (AWG) copper wire has been found to be suitable. However, different gauges may be suitable for different applications. "Wire" as used herein does not refer to printed or printed-and-etched patterns of conductive material. Rather, as used herein, wire refers to one or more strands of conductive material that have been made by drawing the conductive material through draw plates, for example. The wiring may be soldered or ultrasonically welded to the bond pads. Though only power wiring is shown, it will be recognized that the lighting apparatus may include additional wiring for pulse width modulation and other control such as color temperature and brightness. The additional wiring may be accommodated with additional bond pads on the straps/lead frames and connections to the LED components.

For bare wires, an electrically insulative layer (see FIG. 3) may be attached to the sheet metal troffer to insulate the wiring from the troffer. For example, a polyester backed tape may have adhesive on two surfaces, one for attaching to the sheet metal member and the other to which the LED components and wiring may be attached. For insulated wires, no electrically insulative layer is needed.

The lighting apparatus 100 may further include a controller 120, which may include a microprocessor and supporting circuitry. The controller 120 is attached to one of the adhesive strips 108 and is connected to strings of the LEDs for providing power and control. Control lines are not shown in order to avoid cluttering the figure. As indicated above, the controller 120 may control pulse width modulation, color temperature, and brightness. Also, the controller may be placed on the sheet metal member 104 at a location other than the location that is shown in order to improve efficiency. Though not shown, it will be appreciated that the controller has terminals for connecting to a power supply module (not shown).

The lighting apparatus 100 may further include both a barrier sheet (not shown) and a diffuser (not shown). The barrier sheet may have openings aligned with the LED components, and the barrier sheet may be disposed over and cover the adhesive strips 108, wiring 116, and parts 118 of the sheet metal member 104 not covered by the adhesive strip. The barrier layer may be white to provide reflectivity and made from polyester. In addition to the barrier sheet, an acrylic diffuser may be disposed over the LED elements and secured by the support structure 102.

Figure 2:
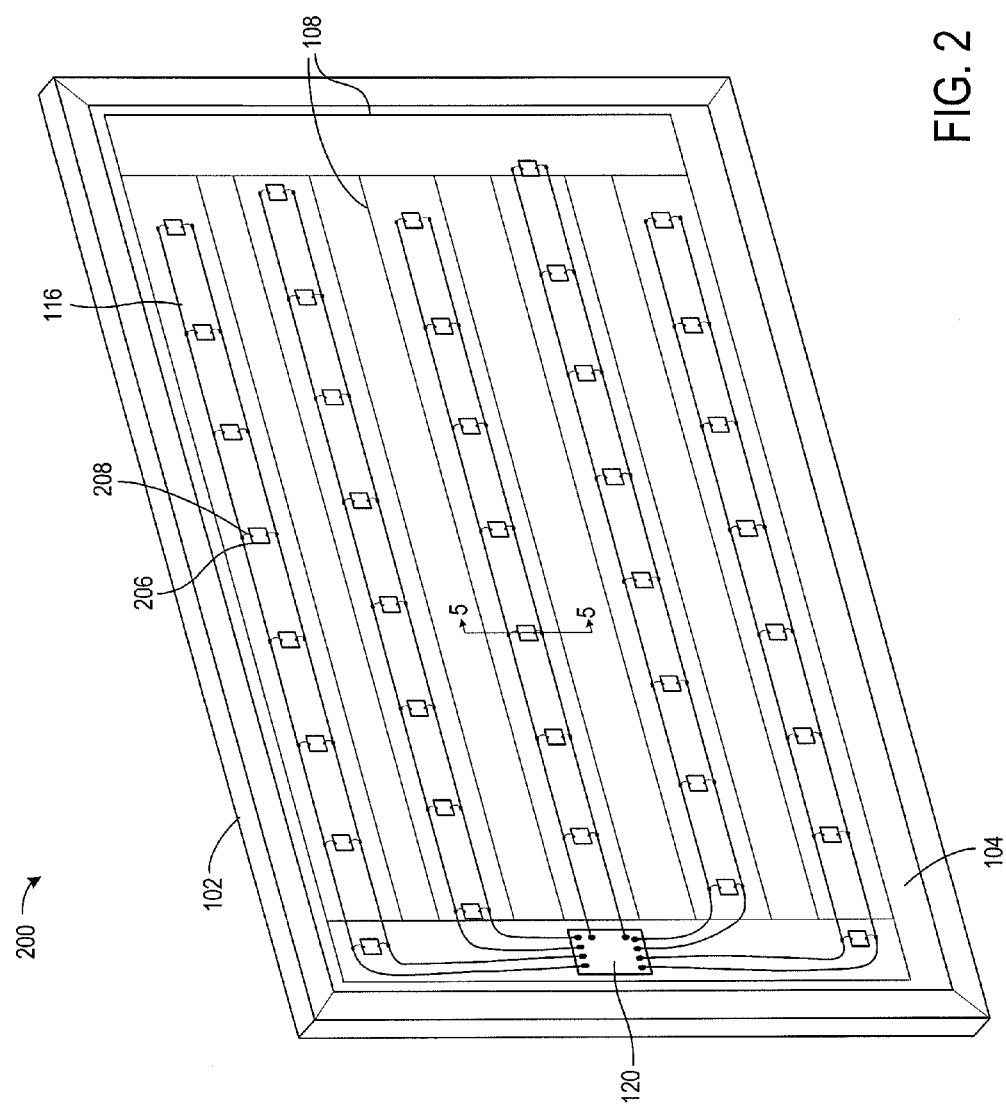
FIG. 2 shows an LED lighting apparatus having adhesive strips attached to a surface of a sheet metal member of a support structure.

Though not shown in FIG. 1 or 2, it will be appreciated that additional supporting circuitry may be attached to the support structure and coupled to the LED components. For example, a power factor control module and current control devices may be connected to the LEDs. The additional devices and wiring may be attached to the adhesive layer as are the LED components.

FIG. 2 shows an LED lighting apparatus having adhesive strips attached to a surface of a sheet metal member of a support structure. The lighting apparatus 200 includes a support structure 102 and multiple LED elements attached to a sheet metal member 104 of the support structure. LED element 206 is an example of one of the LED elements, and the LED elements may be bare or packaged LEDs. Elements 102, 104, 108, 116, and 120 may be as described in the description of FIG. 1.

The LED elements are wire bonded to the wiring 116. For example, bond wire 208 connects LED element 206 to the wire 116. In an example implementation, the wire 116 is copper, and the bond wire 208 may be gold, aluminum, or copper with gold plating. Aspects of wire bonding to a round wire are also described in U.S. Pat. No. 9,431,363 entitled, "Wire Bonded IC Components to Round Wire," by Scott Lindblad et al., which is assigned to the same assignee as the present application, and the entire contents of the patent are incorporated herein by reference.

For bare wires, an electrically insulative layer (see FIG. 5) may be attached to the sheet metal troffer to insulate the wiring from the troffer. For insulated wires, no electrically insulative layer is needed.

The lighting apparatus 200 may further include both a barrier sheet (not shown) and a diffuser (not shown). The barrier sheet may have openings aligned with the LED elements or LED components, and the barrier sheet may be disposed over and cover the adhesive strips 108, wiring 116, and parts 118 of the sheet metal member 104 not covered by the adhesive strip. The barrier layer may be white to provide reflectivity and made from polyester. In addition to the barrier sheet, a diffuser may be disposed over the LED components and secured by the support structure 102.

Figure 3:
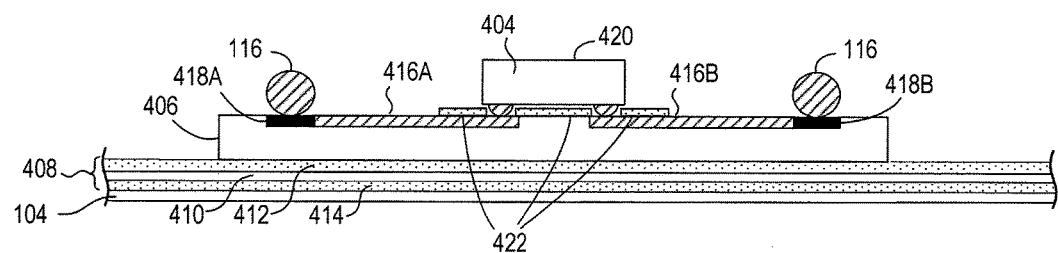
FIG. 3 is a cross-sectional view of an LED component and strap disposed on a sheet metal member.

FIG. 3 is a cross-sectional view of an LED component and strap disposed on a sheet metal member. The cross sectional view shown in FIG. 3 is in the direction of cross section 3 of FIG. 1. The cross-sectional view shows an LED component 404 that is attached to a strap 406. The strap is attached to the sheet metal member by an adhesive layer 408.

Adhesive layer 408 may include multiple sublayers of adhesive material and a backing layer, or a single layer of adhesive material, depending on the type of wire used to connect the LED components to power. The adhesive layer 408 shown in FIG. 3 may be suitable for an implementation having a bare wire 116, that is a wire that has no electrically insulative jacket. Adhesive layer 408 includes an electrically insulative sublayer 410, such as a polyester backing, and adhesive sublayers 412 and 414. The polyester backing sublayer 410 provides electrical insulation between the wiring 116 and the sheet metal member 104. In an implementation in which wire 116 is insulated, backing sublayer 410 and adhesive layer 412 may be omitted.

For ease of illustration, the LED component 404 is depicted as a simple block. Given that there are myriad bare LED and packaged LED structures, suitable orientations and connections of the LED component to the metal traces will be recognized for the different embodiments even though the LED component is depicted as a block.

The LED component 404 is electrically connected to metal traces 416A and 416B by soldered connections, for example. The metal traces on the strap lead from the pads at which the LED is connected to terminals 418A and 418B. Being on the surface of the strap that faces away from the substrate, the terminals are thereby exposed for connection to power wiring. Wire 116 is electrically attached to terminals 418A and 418B. In one embodiment, the wire is soldered or ultrasonically welded to the terminals, and in another embodiment the wire is attached to the terminals with a conductive adhesive.

For a packaged LED, a light-emitting surface 420 of LED 404 faces away from the sheet metal member 104. For an unpackaged LED, a mirror layer 422 may be sputtered on strap 406 to reflect light, which is emitted from the LED toward the strap 406. The sputtered mirror layer may be a highly reflective metallic material, for example.

Figure 4:
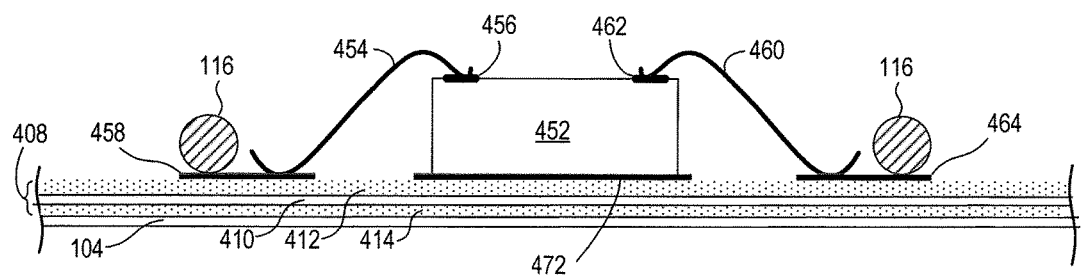
FIG. 4 is a cross-sectional view of an LED component and lead frame disposed on a sheet metal member and wire bonded to pads of the lead frame.

FIG. 4 is a cross-sectional view of an LED component and lead frame disposed on a sheet metal member and wire bonded to pads of the lead frame. Elements 104, 116, 408, 410, 412, 414 may be as described in the description of FIG. 3.

The cross sectional view shows portions of a lead frame that are attached to the sheet metal member 104 by an adhesive layer 408. The illustrated portions of the lead frame include bond pads 458 and 464 and portion 472. The LED component 452 may be attached to the portion 472 of the lead frame by either a pressure sensitive or thermally conductive adhesive. The wire 116 and bond wires 454 and 460 may be attached to the pads 458 and 464 of the lead frame by solder, ultrasonic welding, or by a conductive adhesive.

Bond wire 454 connects the contact pad 456 of the LED component 452 to the pad 458 of the lead frame, and bond wire 460 connects the contact pad 462 of the LED component to the pad 464 of the lead frame. The bond wires may be wedge bonded to the LED component and lead frame pads to provide a low profile. In other applications, the bond wires may be ball bonded. In an example implementation, the wire 116 is copper, and the bond wires may be gold, aluminum, or copper with gold plating.

Figure 5:
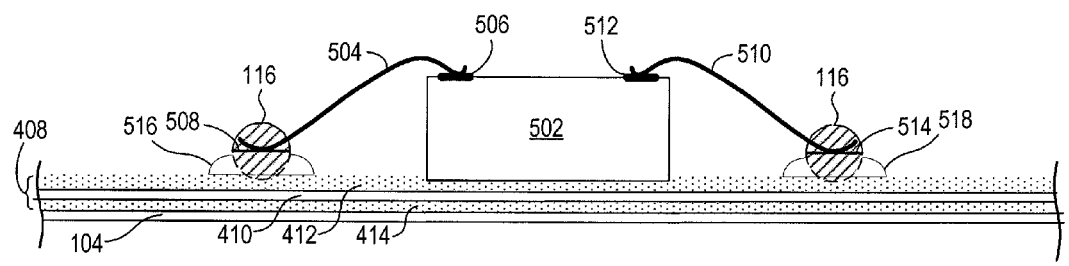
FIG. 5 is a cross-sectional view of an LED component disposed on a sheet metal member and wire bonded to wires that are also disposed on the sheet metal member.

FIG. 5 is a cross-sectional view of an LED component disposed on a sheet metal member and wire bonded to wires that are also disposed on the sheet metal member. The cross sectional view shown in FIG. 5 is in the direction of cross section 5 of FIG. 2 and shows LED component 502 that is attached to the sheet metal member 104 by an adhesive layer 408. Elements 104, 116, 408, 410, 412, 414 may be as described in the description of FIG. 3.

Bond wire 504 connects the contact pad 506 of the LED component 502 to the planar landing area 508 of the wire 116, and bond wire 510 connects the contact pad 512 of the LED component to the planar landing area 514 of the wire. The bond wires may be wedge bonded to the LED component and wire to provide a low profile. In other applications, the bond wires may be ball bonded. In an example implementation, the wire 116 is copper, and the bond wires may be gold, aluminum, or copper with gold plating. The portions of the antenna wire that connect to the bond wires 504 and 510 may be stabilized by beads 516 and 518 of adhesive.

Figure 6:
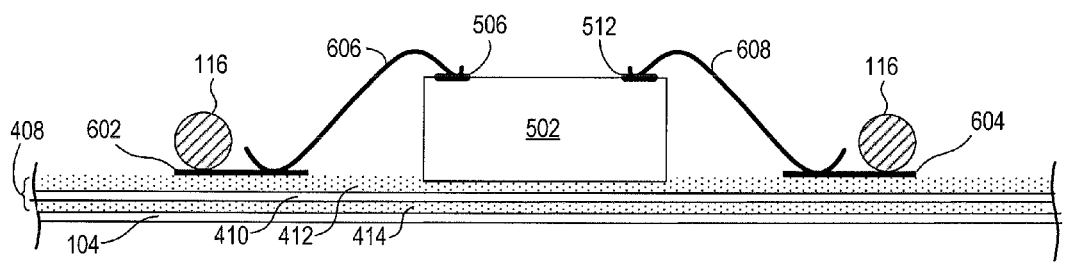
FIG. 6 shows a cross-sectional view of an LED component disposed on a sheet metal member and wire bonded to wires that are also disposed on the sheet metal member.

FIG. 6 shows a cross-sectional view of an LED component disposed on a sheet metal member and wire bonded to wires that are also disposed on the sheet metal member. The cross-sectional view of FIG. 6 is similar to that of FIG. 5, except that the bond wires are not directly attached to the wire 116. Instead, conductive landing pads 602 and 604 provide an electrical connection between the bond wires 606 and 608 and the wire 116. The bond wires may be wedge bonded or ball bonded to the landing pads, and the wire may be soldered or ultrasonically welded to the landing pad. Elements 104, 116, 408, 410, 412, 414, 502, 506 and 512 may be as previously described.

Figure 7:
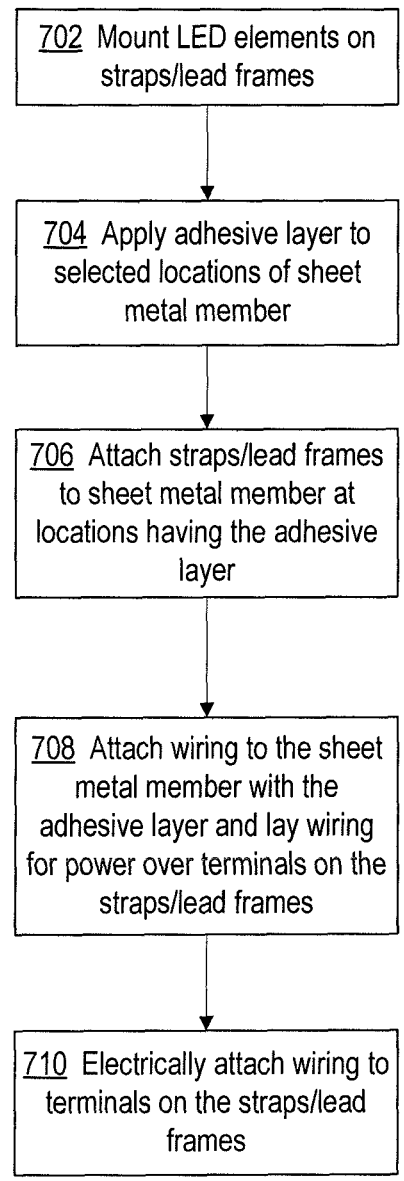
FIG. 7 shows a flowchart of a process of constructing a lighting apparatus according to one implementation.

FIG. 7 shows a flowchart of a process of constructing a lighting apparatus according to one implementation. At block 702, LED components are mounted on straps or lead frames. One or more LED components may be attached to a single strap/lead frame, depending on application requirements. The LED components may be bare or packaged LEDs.

At block 704, an adhesive layer is applied to a surface of a sheet metal member, such as a panel of a troffer. The adhesive may be a pressure sensitive adhesive or a thermally conductive adhesive and applied to selected locations on the surface of the sheet metal member at which the straps/lead frames and wiring are to be attached. The straps/lead frames are attached to the sheet metal member at the locations having the adhesive layer at block 706.

At block 708, wiring is attached to the surface of the sheet metal member having the adhesive layer. The wiring includes wires for power and control and is laid over terminals on the straps/lead frames. The wires are connected to the terminals on the straps/lead frames at block 710, such as by soldering or ultrasonically welding.

Though aspects and features may in some cases be described in individual figures, it will be appreciated that features from one figure can be combined with features of another figure even though the combination is not explicitly shown or explicitly described as a combination.

The present invention is thought to be applicable to a variety of lighting applications. Other aspects and embodiments will be apparent to those skilled in the art from consideration of the specification and practice disclosed herein. It is intended that the disclosed apparatus and method be considered as examples only, with a true scope of the invention being indicated by the following claims.

What is claimed is:

1. A lighting apparatus, comprising:
a support structure having a sheet metal member, the sheet metal member having a first surface;
an adhesive layer directly attached to the first surface of the sheet metal member;
a plurality of straps directly adhered to the adhesive layer;
a plurality of light-emitting diode (LED) components attached to the plurality of straps, respectively; and
a plurality of wires attached to the sheet metal member by the adhesive layer and coupled to the plurality of LED components for providing power to the LED components;
wherein:
each strap of the plurality of straps has a first surface and an opposing second surface, and first and second terminals exposed on the first surface of each strap, the second surface of each strap is directly attached to the adhesive layer, and the plurality of wires are attached on the first surface at the first and second terminals of the plurality of straps, with each terminal being disposed between a wire of the plurality of wires and the adhesive layer, and each of the plurality of wires directly contacts at least three of the first terminals or at least three of the second terminals.

2. The lighting apparatus of claim 1, wherein the adhesive layer is a pressure sensitive adhesive.

3. The lighting apparatus of claim 1, wherein the adhesive layer is a thermally conductive adhesive.

4. The lighting apparatus of claim 1, wherein the support structure is a troffer.

5. The lighting apparatus of claim 1, wherein each LED component is a bare LED die.

6. The lighting apparatus of claim 1, wherein each LED component is a packaged LED die.

7. The lighting apparatus of claim 1, wherein the plurality of LED components are arranged in a plurality of rows.

8. The lighting apparatus of claim 1, wherein:
the plurality of wires are uninsulated; and
the adhesive layer includes a first adhesive sublayer adhered to the first surface of the sheet metal member, an electrically insulative sublayer directly adhered to the first adhesive sublayer, and a second adhesive sublayer adhered to the electrically insulative sublayer.

9. The lighting apparatus of claim 1, wherein the plurality of wires include insulated wire.

10. The lighting apparatus of claim 1, further comprising a diffuser attached to the support structure and disposed over the plurality of LED components.

11. The lighting apparatus of claim 1, wherein the adhesive layer includes a plurality of individual adhesive strips.

12. The A lighting apparatus, comprising:
a support structure having a sheet metal member, the sheet metal member having a first surface;
an adhesive layer directly attached to the first surface of the sheet metal member;
a plurality of light-emitting diode (LED) components directly attached to a second surface of the adhesive layer;
a plurality of wires attached to the sheet metal member by the adhesive layer and coupled to the plurality of LED components for providing power to the LED components,
wherein the plurality of wires have circular cross-sections and portions for connecting to the plurality of LED components, and each portion of a wire has a respective planar landing area extending longitudinally along the wire, and the lighting apparatus further comprising:
bond wires directly connected to the respective planar landing areas and to the plurality of LED components, wherein each of the plurality of wires directly contacts at least three of the bond wires.

13. The lighting apparatus of claim 12, further comprising beads of adhesive disposed on the adhesive layer.

14. The lighting apparatus of claim 12, wherein the plurality of wires are copper, and the bond wires are one of gold, aluminum, or copper with gold plating.

15. A lighting apparatus, comprising:
a support structure having a sheet metal member, the sheet metal member having a first surface;
an adhesive layer directly attached to the first surface of the sheet metal member;
a plurality of lead frames directly adhered to the adhesive layer;
a plurality of light-emitting diode (LED) components attached to the lead frames; and
a plurality of wires attached to the sheet metal member by the adhesive layer and coupled to the plurality of LED components for providing power to the LED components;
wherein:
each lead frame of the plurality of lead frames has first and second bond pads;
at least one LED component of the plurality of LED components is connected by bond wires to the first and second bond pads of a lead frame of the plurality of lead frames, respectively;
the plurality of wires are attached to the first and second bond pads of the plurality of lead frames, with each bond pad being disposed between a wire of the plurality of wires and the adhesive layer.

16. A method of making a lighting apparatus, comprising:
applying an adhesive layer to a first surface of a sheet metal member;
attaching a plurality of straps having a plurality of LED components to the sheet metal member with the plurality of straps adhered directly to the adhesive layer, wherein each strap of the plurality of straps has a first surface and an opposing second surface and first and second terminals exposed on the first surface of each strap, and the second surface of each strap is directly attached to the adhesive layer;
attaching a plurality of wires to the sheet metal member by the adhesive layer, wherein each of the plurality of wires directly contacts at least three of the first terminals or at least three of the second terminals; and
attaching the plurality of wires to the first surfaces at the first and second terminals of the plurality of straps, with each terminal being disposed between a wire of the plurality of wires and the adhesive layer.

17. The method of claim 16, wherein:
the applying of the adhesive layer includes applying a plurality of individual strips of adhesive on the first surface of the sheet metal member; and
the attaching the plurality of LED components includes attaching a respective subset of the plurality of LEDs in a row to each of the individual strips of adhesive.

* * * * *